(12) United States Patent
Lee

(10) Patent No.: US 10,520,532 B2
(45) Date of Patent: Dec. 31, 2019

(54) LOW FREQUENCY NOISE MEASURING APPARATUS WITH ELECTROMAGNETIC SHIELDING CHARACTERISTICS

(71) Applicant: KOREA SENSOR LAB CO., LTD., Daejeon (KR)

(72) Inventor: Soo Min Lee, Daejeon (KR)

(73) Assignee: KOREA SENSOR LAB CO., LTD., Daejeon (KR)

( * ) Notice: Subject to any disclaimer, the term of this patent is extended or adjusted under 35 U.S.C. 154(b) by 49 days.

(21) Appl. No.: 16/073,756

(22) PCT Filed: Jul. 13, 2017

(86) PCT No.: PCT/KR2017/007537
§ 371 (c)(1),
(2) Date: Jul. 27, 2018

(87) PCT Pub. No.: WO2018/012908
PCT Pub. Date: Jan. 18, 2018

(65) Prior Publication Data
US 2019/0056439 A1 Feb. 21, 2019

(30) Foreign Application Priority Data
Jul. 15, 2016 (KR) .................. 10-2016-0090112

(51) Int. Cl.
| | |
|---|---|
| G01R 29/08 | (2006.01) |
| G01R 29/26 | (2006.01) |
| G01R 23/20 | (2006.01) |
| G10K 11/16 | (2006.01) |

(52) U.S. Cl.
CPC ......... G01R 23/20 (2013.01); G01R 29/0821 (2013.01); G01R 29/0835 (2013.01); G01R 29/26 (2013.01); G10K 11/16 (2013.01)

(58) Field of Classification Search
CPC .................. G01R 29/0821; G01R 29/0835
See application file for complete search history.

(56) References Cited

U.S. PATENT DOCUMENTS

| | | | | |
|---|---|---|---|---|
| 6,088,582 A | * | 7/2000 | Canora ............. | G01R 29/0821 455/226.1 |
| 6,657,214 B1 | * | 12/2003 | Foegelle ........... | G01R 29/0821 250/496.1 |
| 7,286,961 B2 | * | 10/2007 | Kildal ............... | G01R 29/0821 702/182 |

(Continued)

FOREIGN PATENT DOCUMENTS

| | | |
|---|---|---|
| JP | 2005-114377 A | 4/2005 |
| JP | 2007-101445 A | 4/2007 |

(Continued)

OTHER PUBLICATIONS

Machine Translation for KR 10-1518213, published May 15, 2015, translated on Nov. 11, 2019, 15 pages (Year: 2015).*

*Primary Examiner* — Hung V Ngo
(74) *Attorney, Agent, or Firm* — Patent Office of Dr. Chung Park

(57) ABSTRACT

The present invention relates to an apparatus for measuring low frequency noise having shielding characteristics, and enhance the accuracy of measurement of low frequency noise of a sample by blocking the flow of electromagnetic waves in the gap between the chamber and the door.

8 Claims, 15 Drawing Sheets

(56) References Cited

U.S. PATENT DOCUMENTS

| | | | |
|---|---|---|---|
| 8,530,756 B1* | 9/2013 | Winch | H05K 9/0001 174/382 |
| 8,786,502 B2* | 7/2014 | Ho | G01R 29/105 343/703 |
| 2011/0155725 A1* | 6/2011 | Valenzuela Valdes | G01R 29/0871 219/756 |
| 2013/0033279 A1* | 2/2013 | Sozanski | G01R 29/0821 324/750.27 |
| 2013/0257468 A1* | 10/2013 | Mlinarsky | G01R 1/18 324/750.27 |
| 2014/0239976 A1* | 8/2014 | Luo | G01R 29/0821 324/602 |
| 2019/0195928 A1* | 6/2019 | Zwerger-Schuster | G01R 29/0835 |
| 2019/0302184 A1* | 10/2019 | Rowell | H01Q 3/16 |
| 2019/0331718 A1* | 10/2019 | Cummings | G01R 29/10 |

FOREIGN PATENT DOCUMENTS

| | | |
|---|---|---|
| JP | 4718437 B2 | 7/2011 |
| KR | 10-1518213 B1 | 5/2015 |
| KR | 10-2015-0077688 A | 7/2015 |

\* cited by examiner

[Fig. 1]
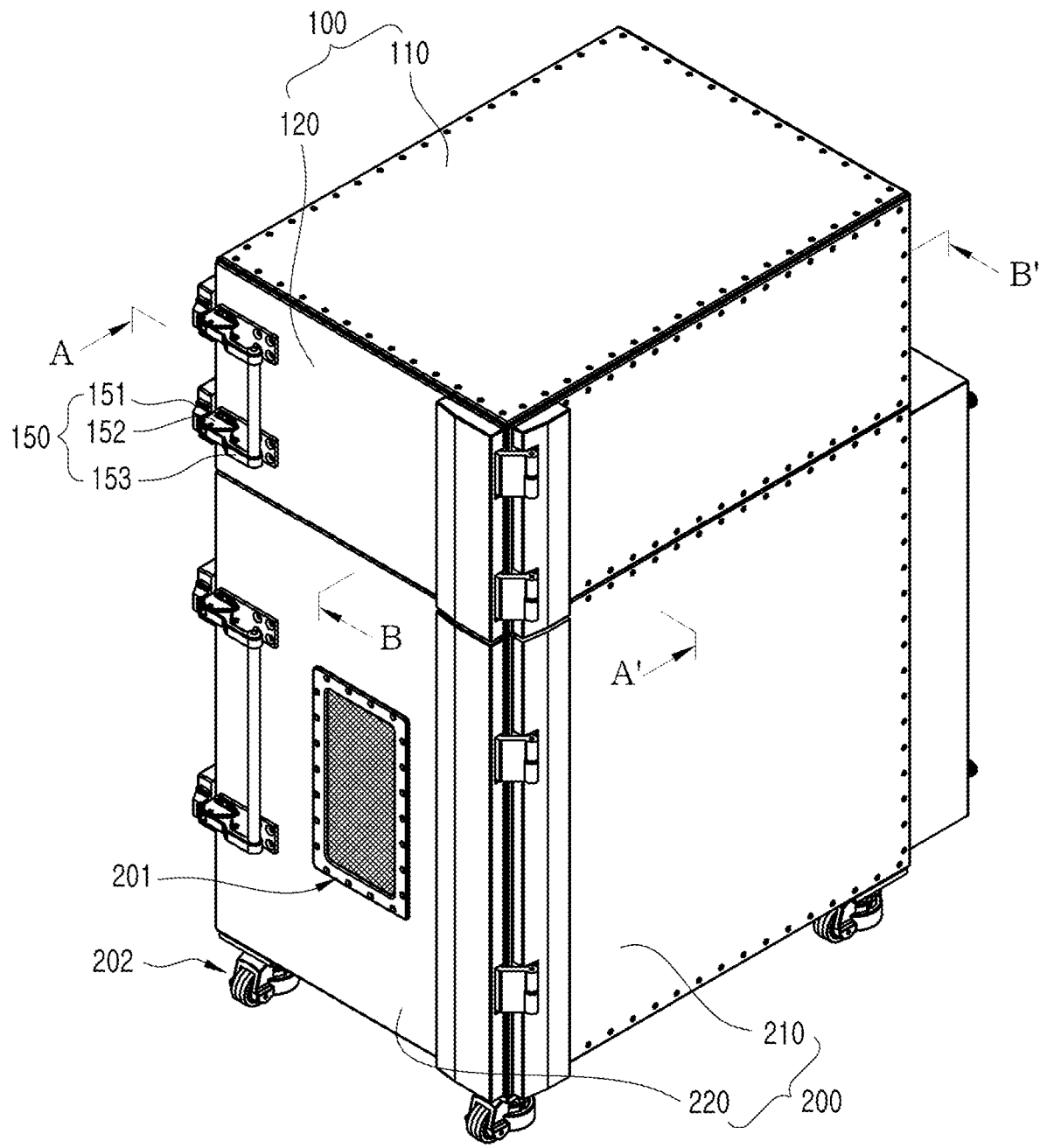

[Fig. 2]
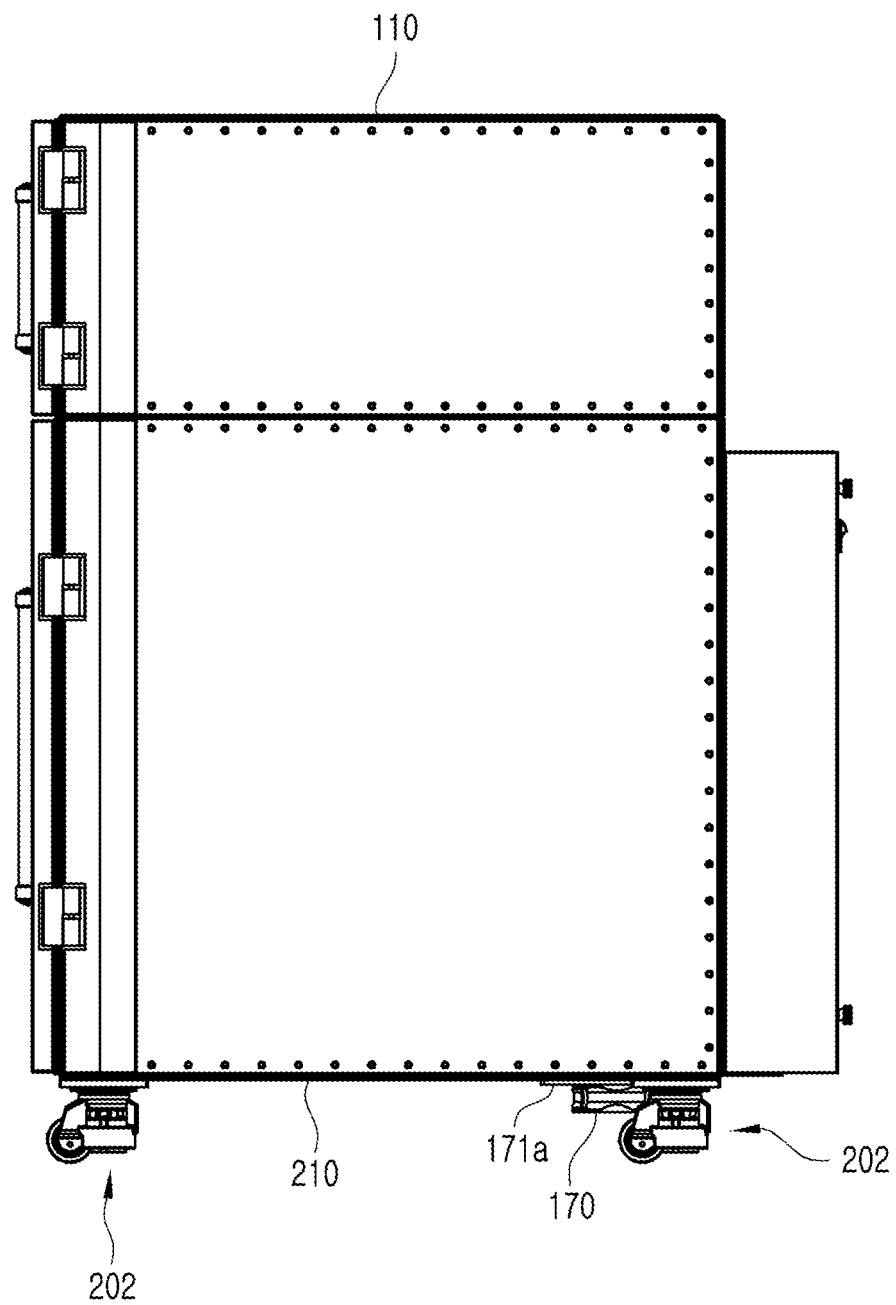

[Fig. 3]
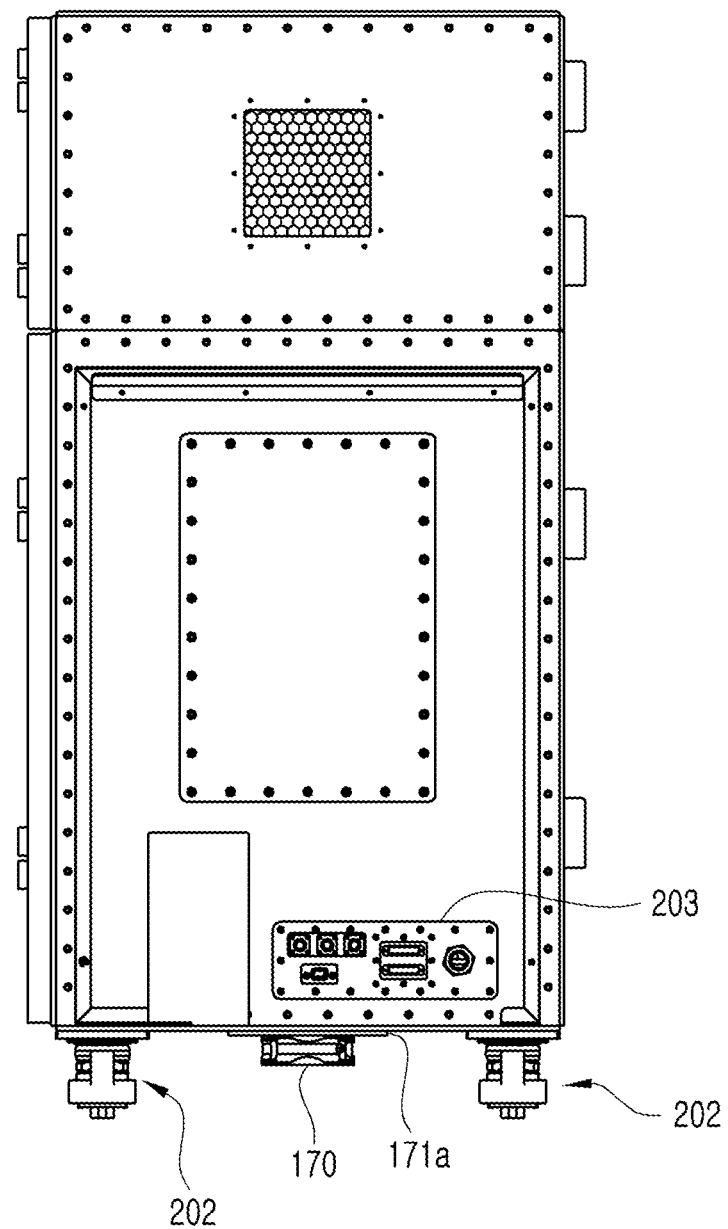

[Fig. 4]
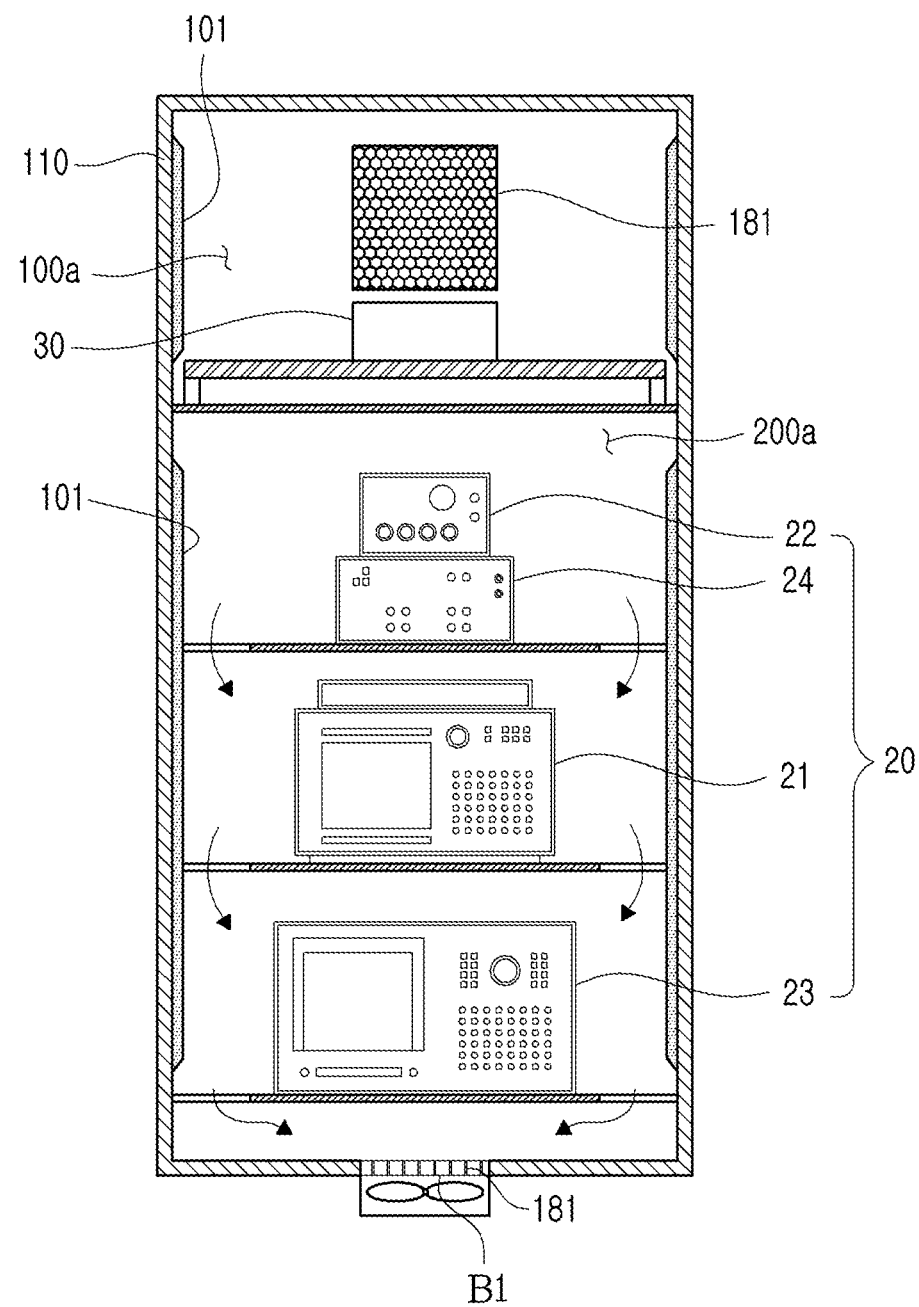

[Fig. 5A]
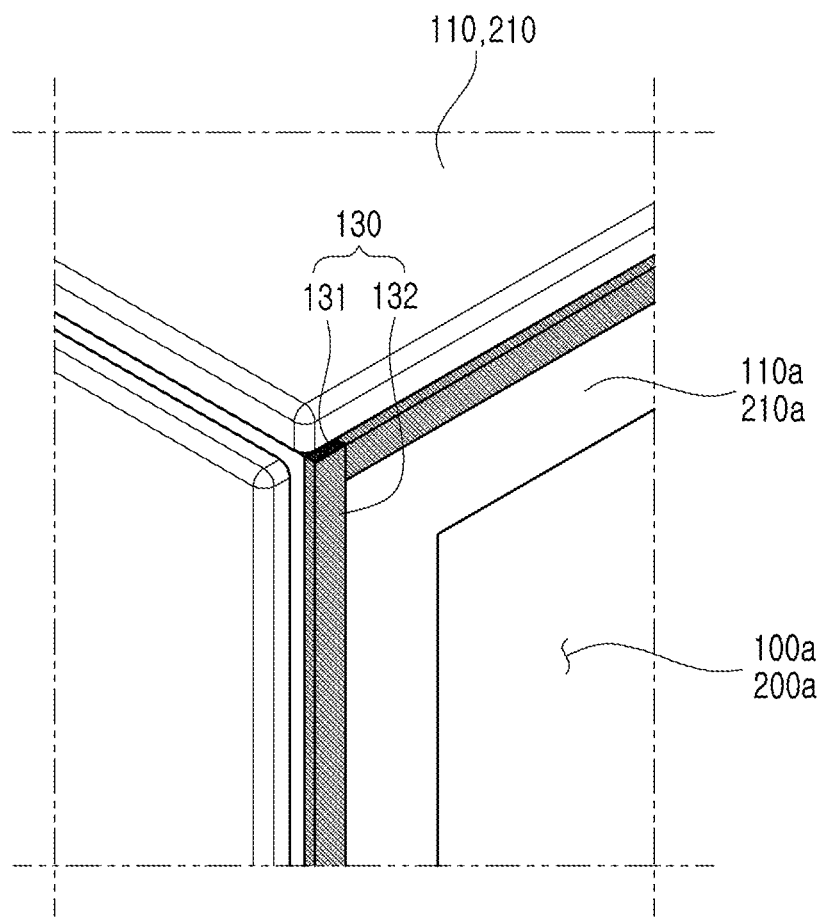

[Fig. 5B]
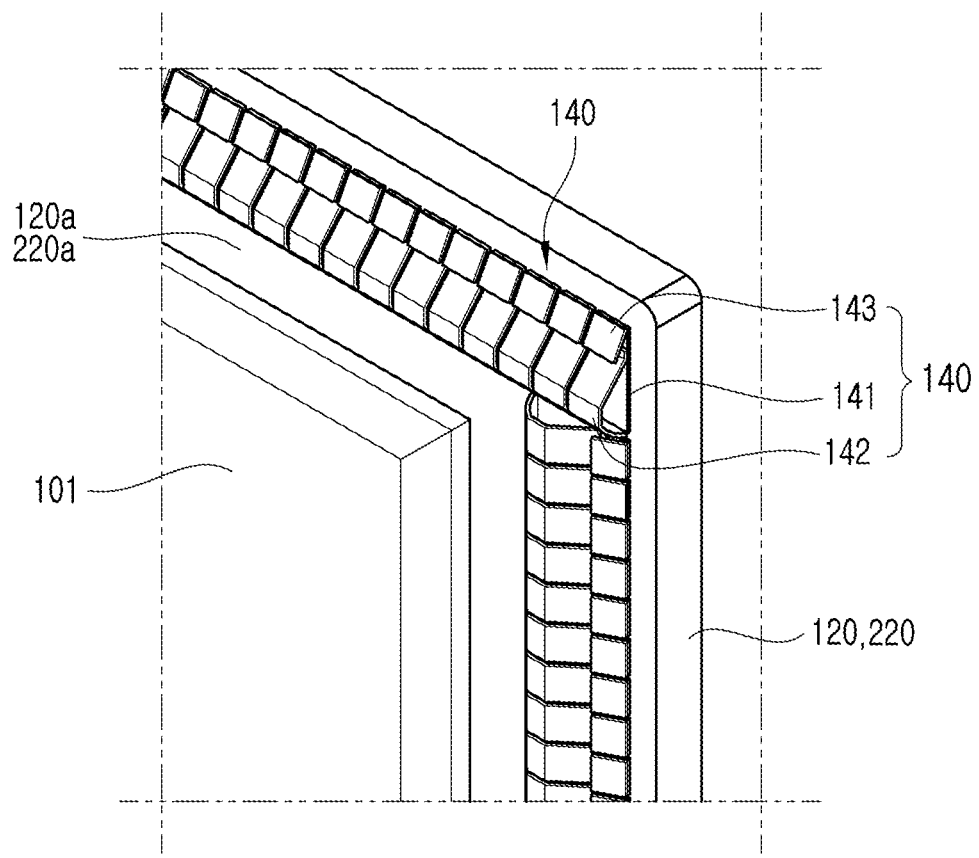

[Fig. 6A]
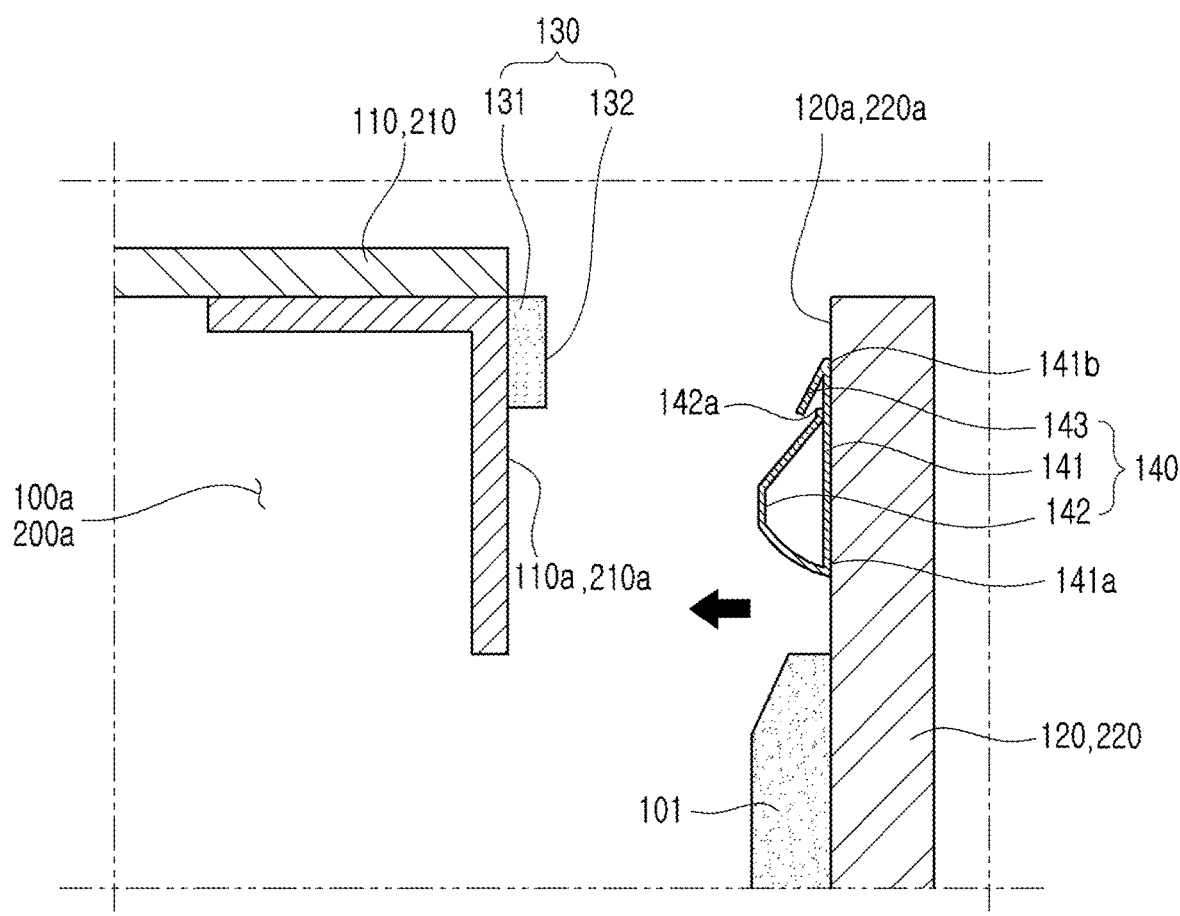

[Fig. 6B]
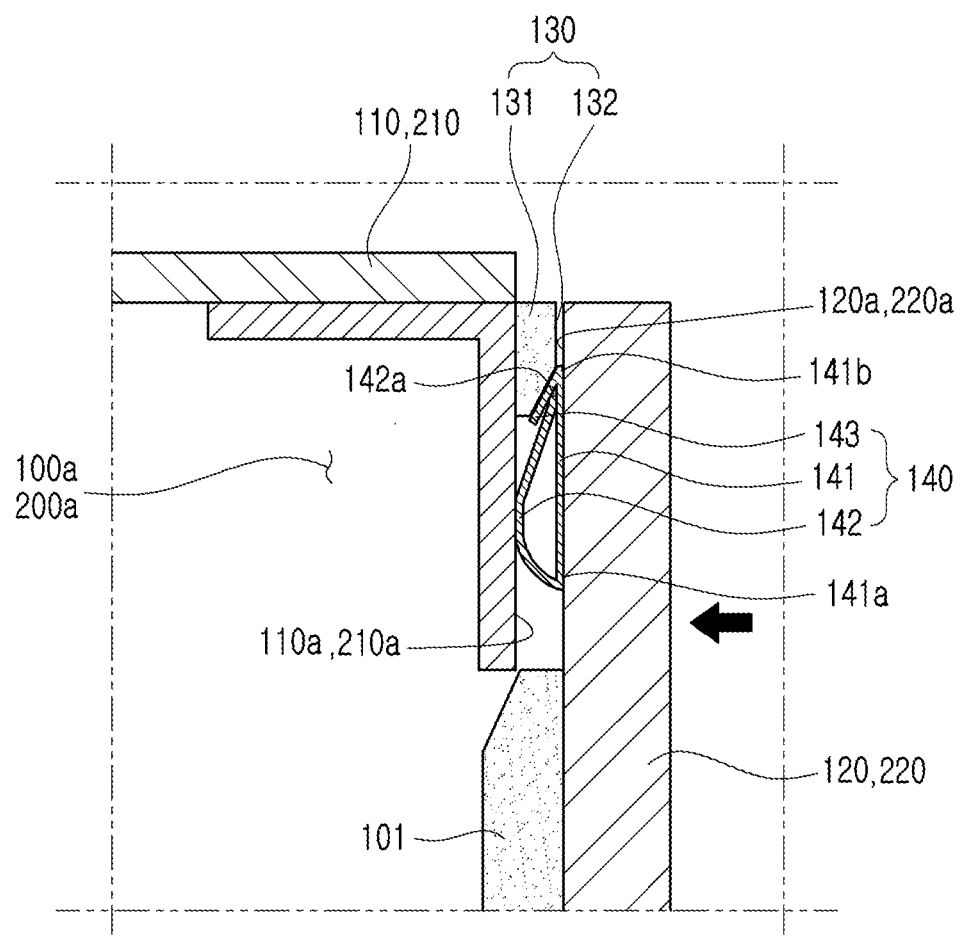

[Fig. 7]
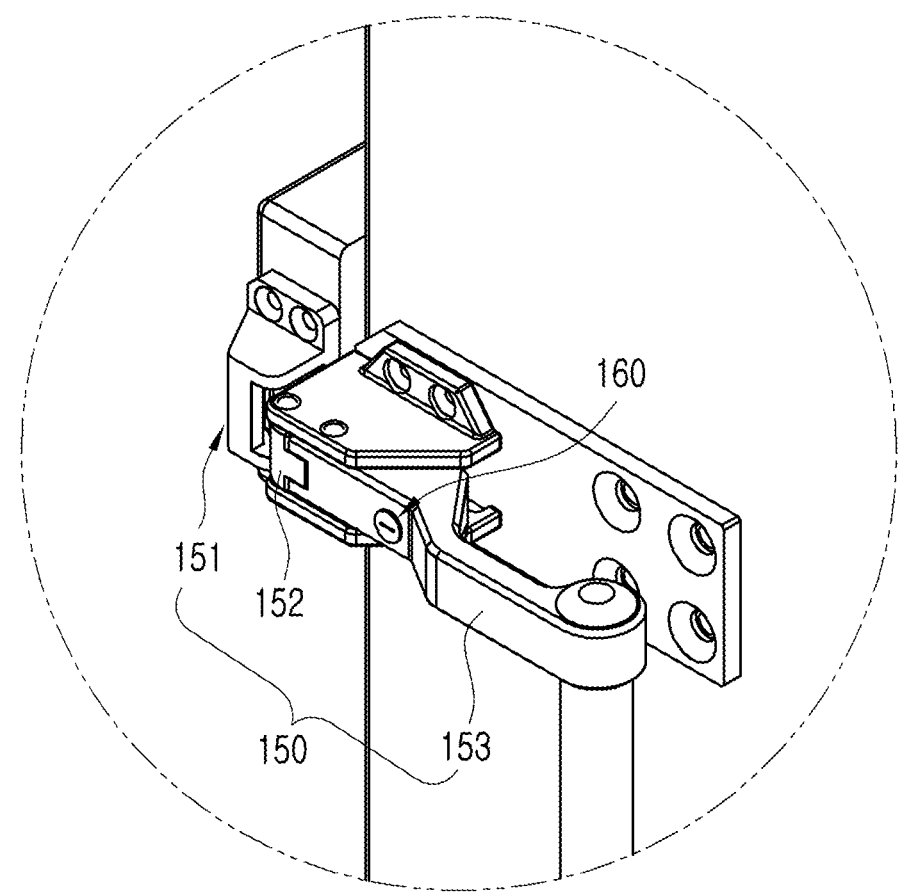

[Fig. 8A]
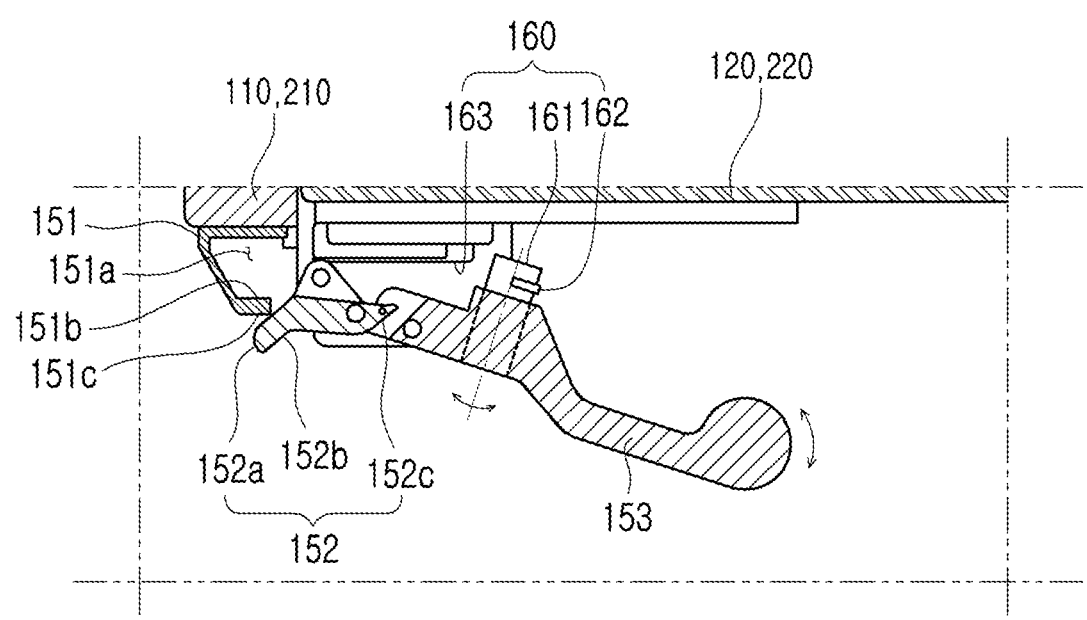

[Fig. 8B]
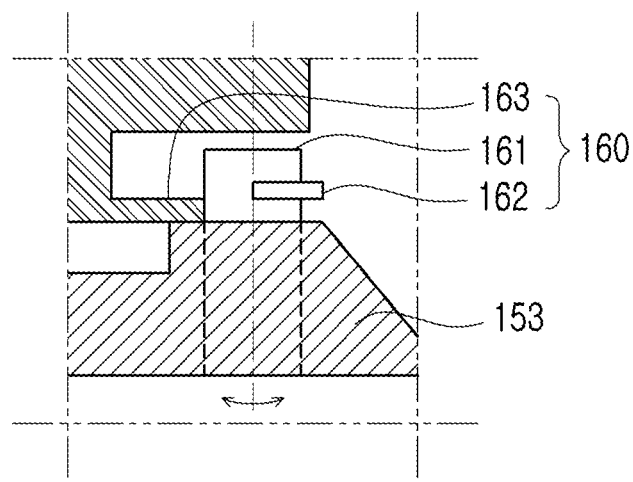
[Fig. 8C]
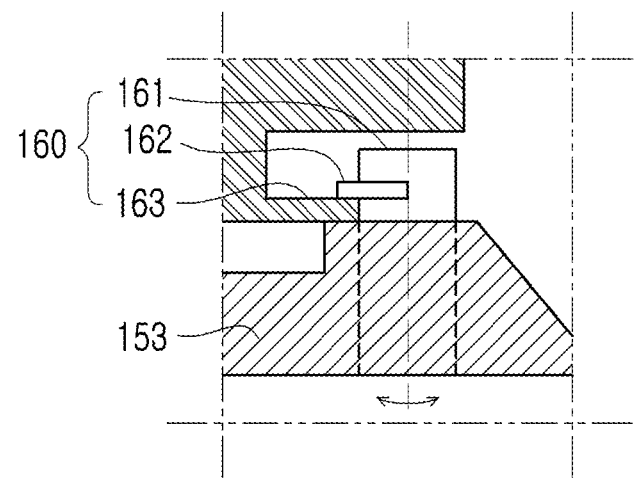

[Fig. 9]
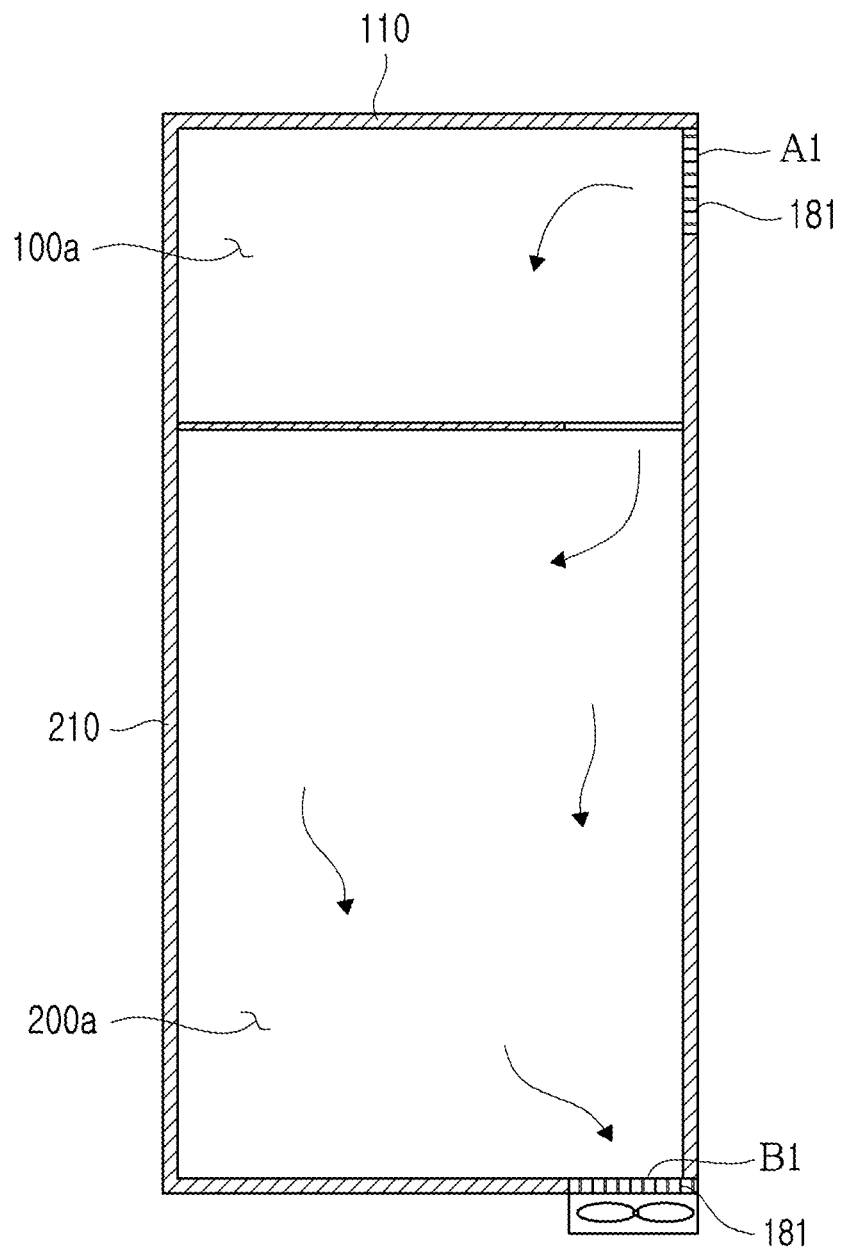

[Fig. 10]
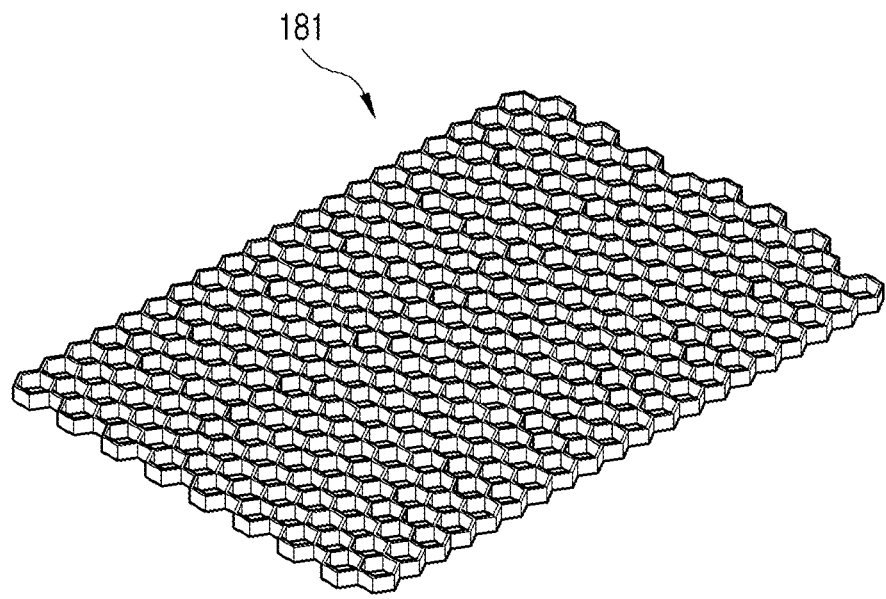
[Fig. 11]
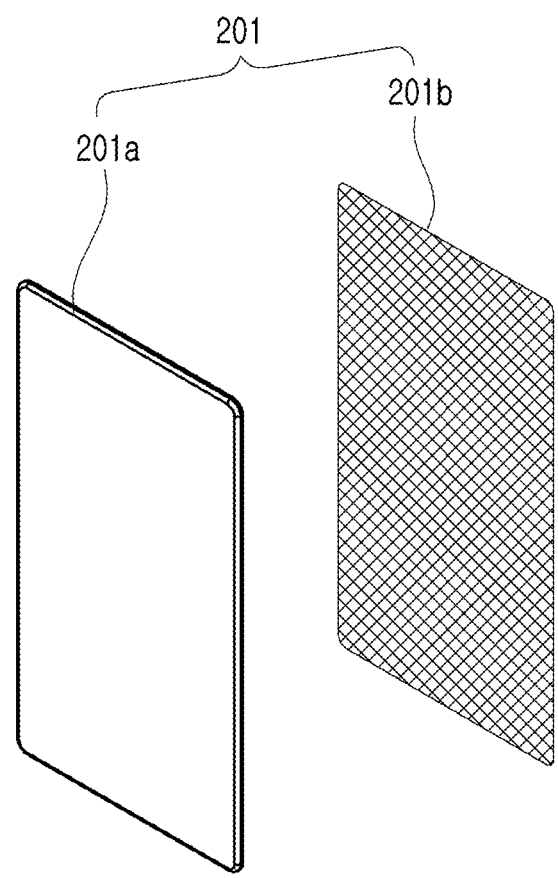

[Fig. 12]
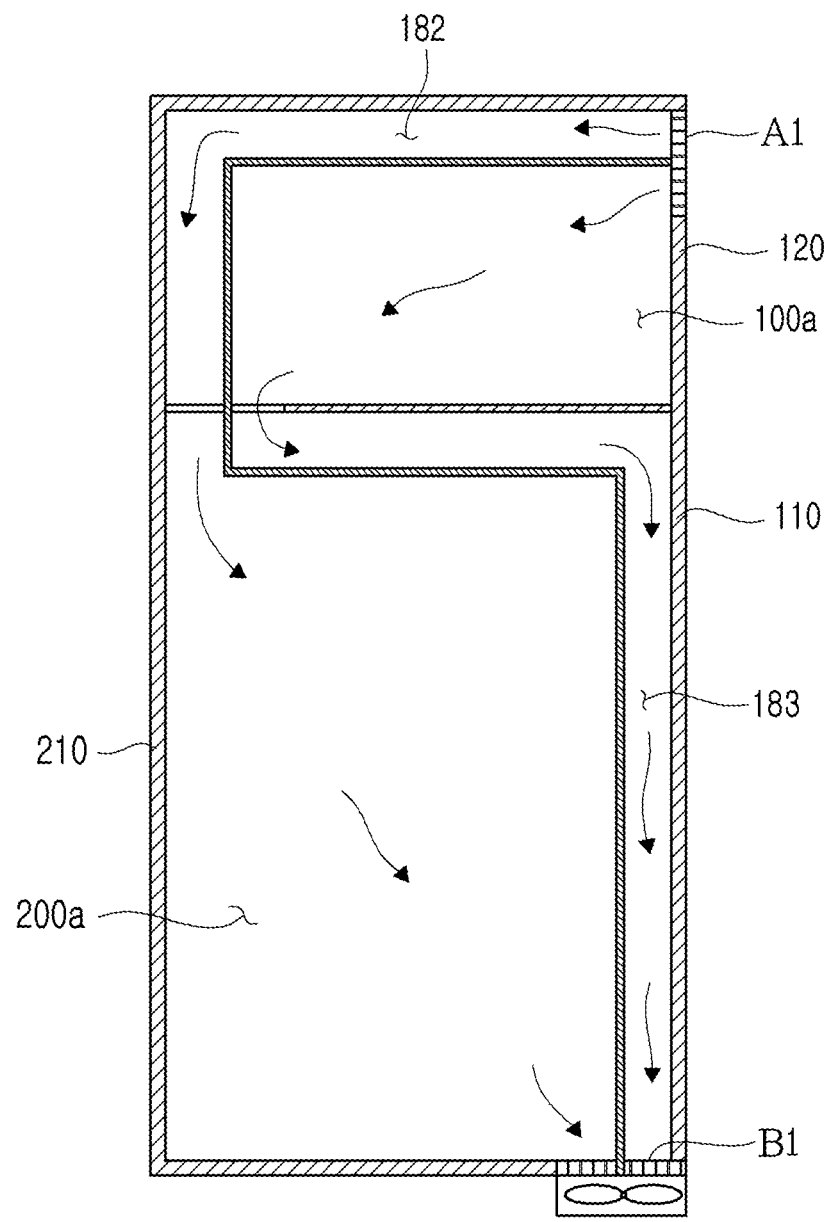

[Fig. 13]
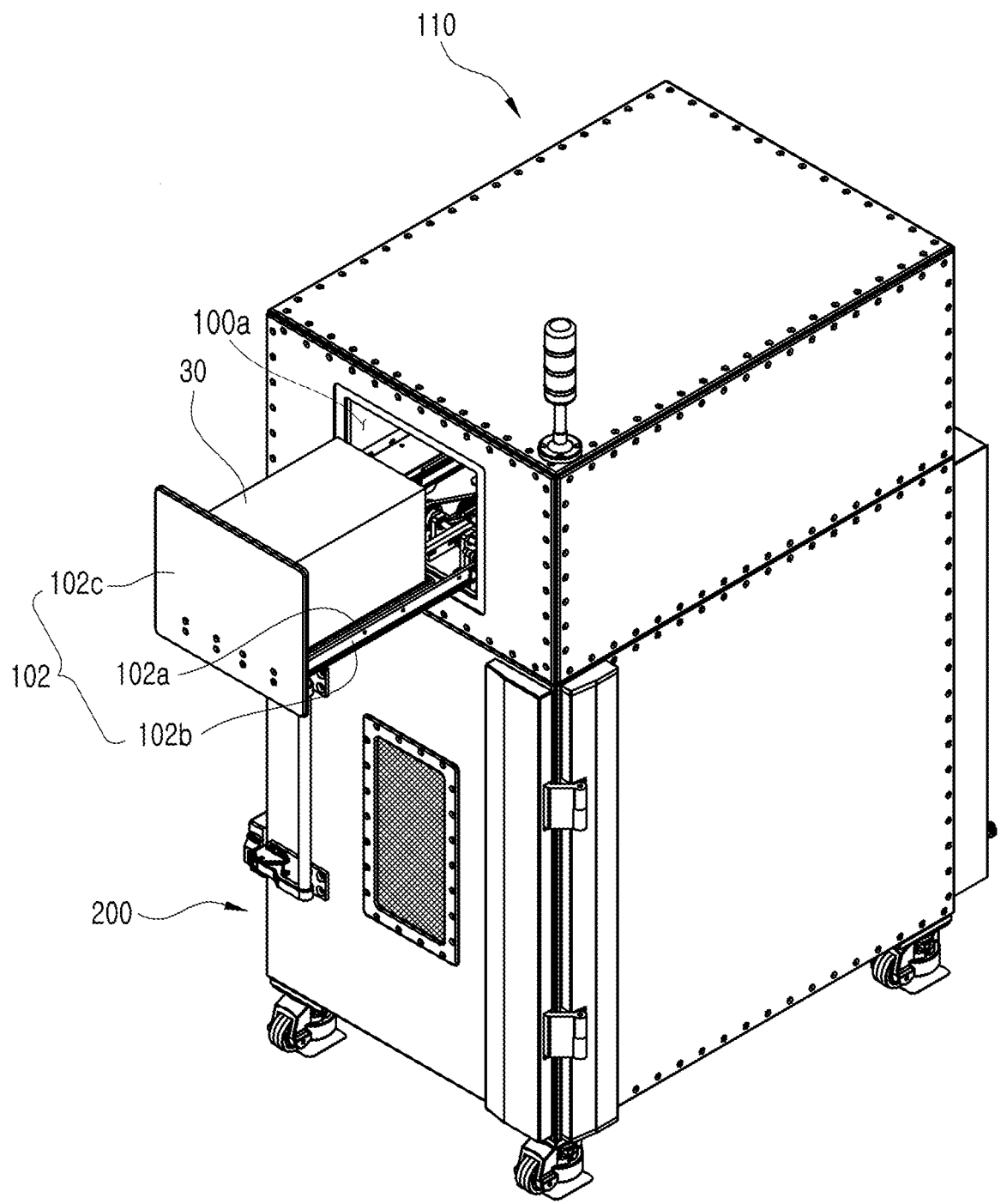

LOW FREQUENCY NOISE MEASURING APPARATUS WITH ELECTROMAGNETIC SHIELDING CHARACTERISTICS

TECHNICAL FIELD

The present invention relates to a low frequency noise measuring apparatus having a characteristic of shielding external noise when analysing low frequency noise of a sensor.

BACKGROUND OF ART

Generally, a sensor is a device that detects, divides and measures physical quantities such as heat, light, temperature, pressure, sound and the like, and informs it with a certain signal.

These sensors are utilized in various industrial fields such as home appliances like washing machines and refrigerators, communication equipment such as smart phones, etc., as well as automobiles, buildings, shipbuilding, aviation, and military.

Meanwhile, to improve the accuracy of a sensor, it is necessary to analyse low frequency noise characteristics of the sensor. The analysis of the low frequency noise characteristic of the sensor is performed in an electromagnetically shielded room in which external noise is removed.

Recently, noise shielding apparatus have been developed which improve the accuracy of low frequency noise characteristic analysis of a sensor by removing external noise.

However, the conventional frequency shielding apparatus cannot effectively remove the heat of the sensor, and the low frequency noise measuring apparatus of the sensor, thereby deteriorating the accuracy of the analysis of the low frequency, and as another problem, a frequency is flowed through the gap between the chamber and the door (of the sensor).

DETAILED DESCRIPTION OF THE INVENTION

Technical Problem

The present invention has been made to solve the above-mentioned problems and it provides a low frequency noise measuring apparatus with electromagnetic shielding characteristics for improving accuracy of low frequency noise analysis of a sample.

Solution to Problem

According to an embodiments of the present disclosure, a low frequency noise measuring apparatus with electromagnetic shielding characteristics comprises a second shielding portion adjacent to the first shielding portion, wherein a second shielding room is formed in which a low frequency noise measuring device, which analyses the low frequency noise of the above mentioned sample, is located by being connected to above mentioned sample, and wherein the second shield portion comprises a second chamber forming the second shield room, and a second door installed in the second chamber to open and/or close second shield room.

According to the embodiment, the low frequency noise measuring apparatus with electromagnetic shielding characteristics further comprises an electromagnetic wave shielding portion installed between the second chamber and the second door, wherein the electromagnetic wave shielding portion comprises an elastic material installed at the boundary of the opening of the second chamber, wherein the electromagnetic wave shielding portion is installed in a manner to enclose the elastic material, and a first mesh, which blocks the transmission of the electromagnetic wave, and wherein the elastic material may pressurize the first mesh toward each of the inner surface of the boundary of the opening of the second chamber and the second door, respectively.

According to the embodiment, the low frequency noise measuring apparatus with electromagnetic shielding characteristics may further comprise a fixing portion for fixing the second door to the second chamber in a state where the second door is closed to the second chamber.

According to the embodiment, the fixing portion comprises a fixing body which is installed on the second chamber and forms a first insertion opening, a first fixing piece which fixes the second door to the second chamber by inserting the first fixing piece to the first insertion opening, wherein the first fixing piece is installed in such manner that the second door can rotate, and a handle, wherein one side of is rotatably installed at the second door and the other side is hingedly connected to the distal end of the first fixing piece, and wherein the handle rotates the first fixing piece at a predetermined angle, and when the first fixing piece is inserted in the first insertion opening, the elastic material may pressurize the boundary of the opening of the second chamber and inner surface of the second door.

According to the embodiment, the first fixing piece may comprise a first curved surface that slides with the outer surface of the first fixing body when the first fixing piece is inserted into the first insertion opening, and a first contact surface that extends at the first curved surface and fixes the second door to the second chamber by contacting the inner surface of the first fixing body which forms the first insertion opening.

According to the embodiment, the low frequency noise measuring apparatus with electromagnetic shielding characteristics may further comprise a locking portion which fixes the handle to the second and is installed at the handle.

According to the embodiment, the locking portion comprises a first rotation shaft installed to the handle without disturbing the rotation of the handle, a first rotating piece protruding partially at the distal of the first rotation shaft, and a first contacting piece installed at the second door, and is selectively in contact with the first rotation shaft by rotating the first rotation shaft, and when the first rotating piece comes into contact with the first contact piece, the rotation of the handle may be restricted in a direction away from the outer surface of the second door.

According to the embodiment, the second shielding portion is disposed below the first shielding portion so that the first shielding room communicates with the second shielding room, and an air outflow opening is formed on the bottom surface of the second shielding portion, and an air inlet is formed on a rear surface of the first shielding portion, and a honeycomb vent may be installed on the air inlet and the air outflow opening.

According to the embodiment, the air inlet is larger than the air outflow opening, and a metal mesh may be provided on both sides of the honeycomb vent, which is installed on the air inlet.

According to the embodiment, the air outflow opening is formed in the second shielding portion, and the air inlet is formed in the first shielding portion, and further comprises a second bypass pipe which is disposed at the second shielding room, and a first bypass pipe which is disposed at the first shielding room, wherein the first bypass pipe connects the second shielding room and the air inlet, and the second bypass pipe may connect the first shielding room and the air outflow opening.

According to the embodiment, the low frequency noise measuring apparatus with electromagnetic shielding characteristics may further comprises a rail that is installed at the inside of the first shielding room, a plate which transfers the sample inside and outside the first shielding room by moving inside and outside the first shielding room along the rail, and a shielding door which is fixed to the plate, and selectively opening and closing the first shielding chamber when the plate moves along the rail.

Advantageous Effects of Invention

The low frequency noise measuring apparatus with electromagnetic shielding characteristics according to the present invention may improve the accuracy of measurement of low frequency noise of a sample by blocking the transmission of the electromagnetic waves in the gap between the chamber and the door.

Further, the low frequency noise measuring apparatus with electromagnetic shielding characteristics may remove the heat generated from the sample and the low frequency noise measuring device by flowing external air.

Further, the low frequency noise measuring apparatus with electromagnetic shielding characteristics may improve the reliability when placing a sample inside the low frequency noise measuring apparatus with electromagnetic shielding characteristics or when removing a sample form the low frequency noise measuring apparatus with electromagnetic shielding characteristics.

BRIEF DESCRIPTION OF DRAWINGS

FIG. 1 shows schematically a low frequency noise measuring apparatus with electromagnetic shielding characteristics according to an embodiment of the present invention, FIG. 2 shows a right side view of the low frequency noise measuring apparatus with electromagnetic shielding characteristics of FIG. 1, FIG. 3 shows a rear side view of the low frequency noise measuring apparatus with electromagnetic shielding characteristics of FIG. 1, FIG. 4 shows a cross section taken along line A-A' of FIG. 1, FIGS. 5a to 6b show an electromagnetic wave shielding portion and an elastic pin of the low frequency noise measuring apparatus with electromagnetic shielding characteristics of FIG. 1, FIGS. 7 to 8c show a fixing portion and a locking portion of the low frequency noise measuring apparatus with electromagnetic shielding characteristics of FIG. 1, FIG. 9 shows a cross section taken along line B-B' of FIG. 1, FIG. 10 shows a honeycomb vent of the low frequency noise measuring apparatus with electromagnetic shielding characteristics of FIG. 1, FIG. 11 a second window provided in the second shielding portion of the low frequency noise measuring apparatus with electromagnetic shielding characteristics of FIG. 1, FIG. 12 a circulation process of air in a low frequency noise measuring apparatus with electromagnetic shielding characteristics according to another embodiment the present invention, and FIG. 13 shows a sample loading in a low frequency noise measuring apparatus with electromagnetic shielding characteristics according to another embodiment of the present invention.

DESCRIPTION OF EMBODIMENTS

Hereinafter, with reference to the drawings, a low frequency noise measuring apparatus with electromagnetic shielding characteristics according to an embodiment of the present invention will be described.

FIG. 1 shows schematically a low frequency noise measuring apparatus with electromagnetic shielding characteristics according to an embodiment of the present invention, FIG. 2 shows a right side view of the low frequency noise measuring apparatus with electromagnetic shielding characteristics of FIG. 1, FIG. 3 shows a rear side view of the low frequency noise measuring apparatus with electromagnetic shielding characteristics of FIG. 1, and FIG. 4 shows a cross section taken along line A-A' of FIG. 1.

According to FIGS. 1 to 4, a low frequency noise measuring apparatus 10 with electromagnetic shielding characteristics of the present embodiment comprises a first shielding portion 100 and a second shielding portion 200.

A first shielding room 100a is provided inside the first shielding portion 100, and a sample 30 for measuring a low frequency noise, such as a sensor, etc., is arranged inside the first shielding room 100a.

The first shielding portion 100 may comprise a first chamber 110 and a first door 120.

The first shielding room 100a is formed inside the first chamber 110, and the first shielding room 100a may be selectively opened and closed by installing the first door 120 at the first chamber 110.

Further, the second shielding portion 200 may comprise a second chamber 210 and a second door 220. The second shielding room 200a is formed inside the second chamber 210, and the second shielding room 200a may be selectively opened and closed by installing the second door 220 at the second chamber 210.

A nonwoven fabric 101 made of polyester fibers may be attached at the inner surface of the first chamber 110, which forms the first shielding room 100a, and at the inner surface 120a of the first door 120, respectively. Also, nonwoven fabric 101 made of polyester fibers may be attached at the inner surface of the second chamber 210, which forms the second shielding room 200a, and at the inner surface 220a of the second door 220, respectively (see FIG. 5b).

The nonwoven fabric 101 may be coated with copper (Cu) or nickel (Ni).

For example, the nonwoven fabric 101 may be plated with a Copper plating solution mixed with 1 L of water, 13 g of Copper(II)-sulfate (CuSO45H2O), 45 g of EDTA4Na (Tetrasodium Ethylene Diamine Tetra Acetate), and 16 g of Formaldehyde. Preferably, sodium hydroxide (NaO) may be added to the Copper plating solution to maintain the acidity at 11.8 pH, and the temperature of the Copper plating solution may be 65° C.

Alternatively, the nonwoven fabric 101 may be plated with a Nickel plating solution mixed with 1 L of water, 21 g of Nickel(II)-sulfat (NiSO46H2O), 21 g of Potassium sodium tartrate tetrahydrate (KNaC4H4O6), and 5 g of Sodium Hypophosphite. Preferably, Propionic Acid may be added to the Nickel plating solution to maintain the acidity at 5.1 pH, and the temperature of the Nickel plating solution may be 65° C.

FIGS. 5a to 6b show an electromagnetic wave shielding portion and an elastic pin of the low frequency noise measuring apparatus with electromagnetic shielding characteristics of FIG. 1.

According to FIGS. 5a to 6b, the low frequency noise measuring apparatus 10 with electromagnetic shielding characteristics may further comprise an electromagnetic wave shielding portion 130.

An electromagnetic wave flowing into the first shielding room 100a may be blocked, by disposing the electromagnetic wave shielding portion 130 between the first chamber 110 and the first door 120

Further, an electromagnetic wave flowing into the second shielding room 200a may be blocked, by disposing the electromagnetic wave shielding portion 130 between the second chamber 210 and the second door 220

The electromagnetic wave shielding portion 130 comprises an elastic material 131 and a first mesh 132.

The elastic material 131 is deformed when subjected to an external force and can recover its original shape when an external force is removed.

Further, the first mesh 132 is formed in mesh of metal material and may block a transmission of the electromagnetic waves. For example, the first mesh 132 may be a copper wire mesh made of copper.

The elastic material 131 is installed at the boundary of the opening 110a of the first chamber 110. Therefore, when the first door 120 is closed/opened at the first chamber 110, both side of the elastic material 131 is pressed by the inner surface 120a of the first door 120 and the boundary of the opening 110a of the first chamber 110.

Further, the elastic material 131 may be installed at the boundary of the opening 210a of the second chamber 210. Therefore, when the second door 220 is closed/opened at the second chamber 210, both side of the elastic material 231 is pressed by the inner surface 220a of the second door 220 and the boundary of the opening 210a of the first chamber 210.

Further, since the first mesh 132 is installed to enclose the elastic material 131, when first door 120 is closed at the first chamber 110, the elastic material 131 may press the first mesh 132 with the boundary of the opening 110a of the first chamber 110 and the inner surface 120a of the first door 120, respectively.

Therefore, when the first door 120 is closed at the first chamber 110, the first mesh 132 may be able to block an electromagnetic wave that flows through he gap between the first door 120 and the first chamber 110.

Likewise, when the second door 220 is closed at the second chamber 210, the material 131 may press the first mesh 132 with the boundary of the opening 210a of the second chamber 210 and the inner surface 220a of the second door 220, respectively.

Therefore, when the second door 220 is closed at the second chamber 210, the first mesh 132 may be able to block an electromagnetic wave that flows through the gap between the second door 220 and the second chamber 210.

The low frequency noise measuring apparatus 10 with electromagnetic shielding characteristics may further comprise an elastic pin 140.

An electromagnetic wave that flows into the first shielding room 100a and second shielding room 200a may be blocked, by installing a plurality of the elastic pins 140 at around the outer peripheral side of the inner surface 120a of the first door 120 or around the outer peripheral side of the inner surface 220a of the second door 220, respectively.

The elastic pin 140 is in contact with the first mesh 132 when the first door 120 is closed at the first chamber 110.

Also, the elastic pin 140 is in contact with the first mesh 132 when the second door 220 is closed at the second chamber 110 (see FIG. 5b).

The elastic pin 140 comprises a first part 141, a second part 142 and a third part 143.

The first part 141 is fixed at the first door 120 or the second door 220, respectively.

The second part 142 is extended from one end 141a of the first part 141.

The second part 142 may have a curved shape so that the distal end 142a of the second part 142 may contact one surface of the first part 141. Further, the second part 142 may be elastically deformed.

When the second part 142 is pressed by the boundary of the opening 110a of the first chamber 110 or the boundary of the opening 210a of the second chamber 210, the distal end 142a of the second part 142 may move in the space between the first part 141 and the third part 143 to the other end 141b of the first part 141, in a slide manner on one surface of the first part 141.

The third part 143 is extended form the other end 141b of the first part 141 and may be elastically deformed. The distal end (143) of the third part (143) may be separated from the second portion 142.

When the first door 120 is closed at the first chamber 110, the third part 143 is in contact with the boundary of the opening 110a of the first chamber 110 and the first mesh 132, and the second part 142 is in contact with the boundary of the opening 110a of the first chamber 110.

Also, when the second door 220 is closed at the second chamber 210, the third part 143 is in contact with the boundary of the opening 210a of the second chamber 210 and the first mesh 132, and the second part 142 is in contact with the boundary of the opening 210a of the second chamber 210.

In this case, the third part 143 and the second part 142 may also contact each other.

FIGS. 7 to 8c show a fixing portion and a locking portion of the low frequency noise measuring apparatus with electromagnetic shielding characteristics of FIG. 1.

According to FIGS. 7 to 8c, the low frequency noise measuring apparatus 10 with electromagnetic shielding characteristics may further comprise a fixing portion 150 and a locking portion 160.

The fixing portion 150 may fix the first door 120 to the first chamber 110 in a state where the first door 120 is closed to the first chamber 110.

Further, fixing portion 150 may fix the second door 220 to the second chamber 210 in a state where the second door 220 is closed to the second chamber 210.

The fixing portion 150 may comprise a first fixing body 151, a first fixing piece 152 and a handle 153.

The first fixing body 151 is installed at the first chamber 110 or at the second chamber 210, and a first insertion opening 151a, in which the first fixing piece 152 is inserted, is formed at the first fixing body 151.

Further, the first fixing piece 152 is installed in such a way to enable rotation of the first door 120 or the second door 220, and may be inserted to the first insertion opening 151a to fix the first door 120 to the first chamber 110, or to fix the second door 220 to the second chamber 210.

One side of the handle 153 is rotatably installed on the first door 120 or the second door 220, and the other side of the handle 153 may be attached to a distal end 152c and a hinge of the first fixing piece 152.

Therefore, when the handle 153 rotates at the first door 120 or the second door 220, the first fixing piece 152 hinged to the handle 153 is also rotated at a set angle.

On the other hand, when the handle 153 rotates away from the outer surface of the first door 120, the first fixing piece 152 rotates so as to separate from the first insertion opening 151a, and the first fixing piece 152 is in contact with the inner surface of the first fixing body 151, which forms the first insertion opening 151a, for pressing the first door 120 toward the first chamber 110.

When the first door 120 is pressurized toward the first chamber 110, the elastic pin 140 and the elastic material 131 deform elastically, therefore, the first door 120 may move slightly to the first chamber 110 (see FIG. 6b), the first fixing piece 152 may be separated from the first insertion opening 151a.

Similarly, when the handle 153 rotates away from the outer surface of the second door 220, the first fixing piece 152 rotates so as to separate from the first insertion opening 151a, and the first fixing piece 152 is in contact with the inner surface of the first fixing body 151, which forms the first insertion opening 151a, for pressing the second door 220 toward the second chamber 220.

When the second door 220 is pressurized toward the second chamber 210, the elastic pin 140 and the elastic material 131 deforms elastically, therefore, the second door 220 may move slightly to the second chamber 210 (see FIG. 6b), the first fixing piece 152 may be separated from the first insertion opening 151a.

The first fixing piece 152 may comprise a first curved surface 152a and a first contact surface 152b.

When the first door 120 is pressed toward the first chamber 110, or when the second door 220 is pressed toward the second chamber 210, the first curved surface 152a is slid at the outer surface 151c of the first fixing body 151.

Further, when the first fixing piece 152 is inserted to the first insertion opening 151a, after the first curved surface 152a is slid at the outer surface 151c of the first fixing body 151, the first door 120 is pressed in a direction away from the first chamber 110 by the elastic pin 140 and the elastic material 131, or the second door 220 is pressed in a direction away from the second chamber 210 by the elastic pin 140 and the elastic material 131.

In this case, the first contact surface 152b is in contact with the inner surface 151b of the first fixing body 151, which forms the first insertion opening 151a, to prevent that the first door 120 is opening at the first chamber 110, or prevent that the second door 220 is opening at the second chamber 210.

The locking portion 160 is installed on the handle 153 and can fix the handle 153 to the first door 120 or the second door 220.

The locking portion 160 comprises first rotation shaft 161, a first rotating piece 162, and a first contacting piece 163.

The first rotation shaft 161 is installed at to enable to rotate and the first rotating piece 162 protrudes partially at the distal end of the first rotation shaft 161.

Therefore, when the first rotation shaft 161 rotates, the first rotating piece 162 can also move rotationally.

The first contacting piece 163 is installed at the first door 120 or the second door 220, a space is formed between the first contacting piece 163 and the first door 120, or between the first contacting piece 163 and the second door 220.

Further, a curved surface enclosing a part of the first rotation shaft 161 may be formed at one side of the first contacting piece 163.

When the first rotating piece 162 is moving rotationally, the first rotating piece 162 is inserted to the gap between the first contacting piece 163 and the first door 120, or between the first contacting piece 163 and the second door 220, and at this time, the first rotating piece 162 may contact the first contacting piece 163.

When the first rotating piece 162 is in contact with the first contacting piece 163 in this manner, the rotation of the handle 153 is restricted in the direction away from the outer surface of the first door 120 or the second door 220.

In this embodiment, both of the first shielding portion 100 and the second shielding portion 200 are equipped with the electromagnetic wave shielding portion 130, the elastic pin 140, fixing portion 150, and the locking portion 160, respectively, however it is also possible that only one between the first shielding portion 100 and the second shielding portion 200 is equipped with the electromagnetic wave shielding portion 130, the elastic pin 140, fixing portion 150, and the locking portion 160.

FIG. 9 shows a cross section taken along line B-B' of FIG. 1, FIG. 10 shows a honeycomb vent of the low frequency noise measuring apparatus with electromagnetic shielding characteristics of FIG. 1, FIG. 11 shows a second window provided in the second shielding portion of the low frequency noise measuring apparatus with electromagnetic shielding characteristics of FIG. 1.

According to FIGS. 9 and 10, the second shielding portion 200 is disposed adjacent to the first shielding portion 100 and equips a second shielding room 200a.

A low frequency noise measuring device 20 for analysing a low frequency of the sample 30 is disposed at the second shielding room 200a (see FIG. 4). Further, the second shielding room 200a may communicate with the first shielding room 100a.

For example, the noise frequency measuring device 20 may comprise a spectrum analyser 21, a power supply noise filter 22, a power supply 23 and a low noise amplifier 24, etc.

The spectrum analyser 21 may analyse the nose characteristic of the sample. Further, the power supply noise filter 22 removes the noise of the power, which is transmitted form the power supply 23 to the sample 30.

Further, the low noise amplifier 24 amplifies the low frequency noise which is detected from the sample 30 to transmit it to the spectrum analyser 21.

Meanwhile, the second shielding portion 200 is disposed below the first shielding portion 100. Further, an air outflow opening B1 may be formed at the lower surface of the second chamber 210, and an air inlet A1 may be formed at the rear surface of the first chamber 110.

Therefore, the air flowing into the air inlet A1 sequentially may absorb the heat generated by the sample 30 and the low frequency noise measuring device 20, to be discharged to the air outflow opening B1.

Accordingly, the low frequency noise measuring apparatus 10 with electromagnetic shielding characteristics of the present invention causes the air to flow from the first shielding portion 100 to the second shielding portion 200, therefore, it is possible to prevent the heat generated by the low frequency noise measuring device 20, disposed in the second chamber 200a, being transmitted to the sample 30.

A fan 170 may be installed at the bottom surface of the second shielding portion 200.

The fan 170 may input the external air to the air inlet A1 and then discharge the air through the air outflow opening B1.

A prevention pad 171a may be installed on the fan 170 and the second shielding portion 200. The prevention pad 171a may absorbs vibrations generated from the fan 170 to block vibrations transferred from the fan 170 to the second shielding portion 200 (see FIGS. 2 and 3).

The low frequency noise measuring device 20 may further comprise plural rollers 202. Further, the plural rollers 202 may be fixed at the bottom surface of the second shielding portion 200 to be enabling to transport the low frequency noise measuring device 20 easily.

The low frequency noise measuring apparatus 10 with electromagnetic shielding characteristics may further comprise a honeycomb vent 180, which is installed at the air inlet A1 and the air outflow opening B1.

The honeycomb vent 181 is formed with a honeycomb structure to block the transmission of the electromagnetic wave.

The air inlet A1 may be larger than the air outflow opening B1, and a metal mesh may be installed at both side of the honeycomb vent 181 located at the air inlet A1.

When the air inlet A1 is larger than the air outflow opening B1, the flow velocity of air at the air outflow opening B1 increases, therefore, the heat generated at the low frequency noise measuring device 20 may be discharged more effectively through the air outflow opening B1.

The low frequency noise measuring apparatus 10 with electromagnetic shielding characteristics may further comprise a second window 201.

The second window 201 is installed at the second shielding portion 200, and a user may check from outside through the second window 201 whether or not the low frequency noise measuring device 20 disposed at the second shielding room 200 operates. The second window 201 may block the transmission of the electromagnetic wave.

Such a second window 201 may comprise a glass 201a and a second mesh 201b.

The second mesh 201b is installed together with the glass 201a at the opening, which is formed at the second door 220 of the second shielding portion 200. More particularly, the glass 201a is disposed at the outside of the second shielding room 200a, and the second mesh 201b may be installed at the second shielding room 200a side.

The second mesh 201b may block the transmission of the electromagnetic wave through the glass 201a.

The low frequency noise measuring apparatus 10 with electromagnetic shielding characteristics may equip a socket portion 203 (see FIG. 3). The socket portion 203 may be connected to an external cable and the low frequency noise measuring device 20.

FIG. 12 shows a circulation process of air in a low frequency noise measuring apparatus with electromagnetic shielding characteristics according to another embodiment the present invention.

According to FIG. 12, the low frequency noise measuring apparatus 10 with electromagnetic shielding characteristics may further comprise a first bypass pipe 182 and a second bypass pipe 183.

The first bypass pipe 182 may connect the air inlet A1 and the second shielding room 200a and the second bypass pipe 183 may connect the first shielding room 100a and the air outflow opening B1.

Therefore, since the generated heat of the low frequency noise measuring device 20 installed at the second shielding room 200a is absorbed by the external air flowing in through the first bypass pipe 182 and discharged through the air outflow opening B1, it is able to block the transmission of the heat generated from the low frequency noise measuring device 20 to the first shielding room 100a.

Further, the external air directly flowing into the first shielding room 100a through the air inlet A1 may be discharged to the outside through the air outlet B1, after removing the heat generated from the sample 30.

FIG. 13 shows a sample loading in a low frequency noise measuring apparatus with electromagnetic shielding characteristics according to another embodiment of the present invention.

According to FIG. 13, to another embodiment of the present invention a low frequency noise measuring apparatus with electromagnetic shielding characteristics may further comprise a loading portion 102.

The loading portion 102 may dispose the sample 30 inside the first chamber 110 or take up the sample 30 from the first chamber 110.

The loading portion 102 may comprise a plate 102a, a rail 102b and a shielding door 102c.

The plate 102a is installed at the rail 102b, which is installed at the first shielding room 100a, to move inside and outside of the first shielding chamber 100a.

Accordingly, the sample 30 that is disposed at the upper side of the plate 102a may be transported inside and outside of the first shielding chamber 100a by moving inside and outside of the first shielding chamber 100a along the rail 102b.

The shielding door 102c is fixed to the plate 102a, and when the plate 102a moves along the rail 102b, the shielding door 102c may selectively open and/or close the first shielding room 100a.

The scope of the present invention is not limited to the above-described embodiments but can be implemented in various embodiments within the scope of the appended claims. Without departing from the subject matter of the present invention claimed in the invention that the claims, those of ordinary skill in the art if to anyone deformable range deemed to be within the scope of the claims described in the present invention.

What is claimed is:

1. A low frequency noise measuring apparatus with electromagnetic shielding characteristics comprises,
    a first shielding portion formed a first shielding room in which a sample is disposed, and
    a second shielding portion which is formed with a second shielding room in which a low frequency noise measuring device is connected with the sample to analyze a low frequency noise of the sample and adjacent to the first shielding portion,
    wherein the second shield portion comprises
    a second chamber forming the second shield room,
    a second door installed in the second chamber to open and/or close the second shield room, and
    a fixing portion which includes a first fixing body installed in the second chamber and formed with a first insertion opening, a first fixing piece inserted into the first insertion opening to fix the second door to the second chamber, and a handle of which one side is rotatably installed in the second door and the other side is hinge-coupled to the end of the first fixing piece to rotate the first fixing piece at a predetermined angle and fixes the second door to the second chamber while the second door is closed in the second chamber.

2. The low frequency noise measuring apparatus according to claim 1,
    wherein the first fixing piece comprises
    a first curved surface that slides on the outer surface of the first fixing body when the first fixing piece is inserted into the first insertion opening, and a first contact surface that extends from the first curved surface and fixes the second door to the second chamber by contacting the inner surface of the first fixing body which forms the first insertion opening.

3. The low frequency noise measuring apparatus according to claim 1 further comprises, a locking portion which fixes the handle to the second door and is installed at the handle.

4. The low frequency noise measuring apparatus according to claim 3, wherein the locking portion comprises a first rotation shaft installed rotatable to the handle, a first rotating piece protruding partially at the distal of the first rotation shaft, and a first contacting piece installed at the second door, and is selectively in contact with the first rotation shaft by rotating and moving the first rotation shaft, and when the first rotating piece comes into contact with the first contact piece, the rotation of the handle is restricted in a direction away from the outer surface of the second door.

5. A low frequency noise measuring apparatus with electromagnetic shielding characteristics comprising:

a first shielding portion formed with a first shielding room in which a sample is disposed; and a second shielding portion which is formed with a second shielding room in which a low frequency noise measuring device is connected with the sample to analyze a low frequency noise of the sample and adjacent to the first shielding portion, wherein the first shielding room and the second shielding room communicate with each other, and an air outflow opening is formed in the second shielding portion and an air inflow opening is formed in the first shielding portion.

6. The low frequency noise measuring apparatus of claim 5, wherein honeycomb vents are installed on the air inflow opening and the air outflow opening.

7. A low frequency noise measuring apparatus with electromagnetic shielding characteristics comprising:

a first shielding portion formed with a first shielding room in which a sample is disposed; and a second shielding portion which is formed with a second shielding room in which a low frequency noise measuring device is connected with the sample to analyze a low frequency noise of the sample and adjacent to the first shielding portion, wherein an air outflow opening is formed in the second shielding portion and an air inflow opening is formed in the first shielding portion, a second bypass pipe is disposed in the second shielding room and a first bypass pipe is disposed in the first shielding room, and the first bypass pipe connects the second shielding room and the air inflow opening and the second bypass pipe connects the first shielding room and the air outflow opening.

8. A low frequency noise measuring apparatus with electromagnetic shielding characteristics comprising:

a first shielding portion formed with a first shielding room in which a sample is disposed;

a second shielding portion which is formed with a second shielding room in which a low frequency noise measuring device is connected with the sample to analyze a low frequency noise of the sample and adjacent to the first shielding portion, a rail which is installed inside the first shielding room;

a plate which transfers the sample to the inside and the outside of the first shielding room by moving to the inside and the outside of the first shielding room along the rail; and a shielding door which is fixed to the plate and selectively opens and closes the first shielding room when the plate moves along the rail.

* * * * *